(12) United States Patent
Yoo et al.

(10) Patent No.: US 10,356,911 B2
(45) Date of Patent: Jul. 16, 2019

(54) ELECTRONIC DEVICE MODULE AND METHOD OF MANUFACTURING THE SAME

(71) Applicant: SAMSUNG ELECTRO-MECHANICS CO., LTD., Suwon-Si, Gyeonggi-Do (KR)

(72) Inventors: Do Jae Yoo, Suwon-Si (KR); Jae Hyun Lim, Suwon-Si (KR); Jong In Ryu, Suwon-Si (KR); Kyu Hwan Oh, Suwon-Si (KR); Ki Ju Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 60 days.

(21) Appl. No.: 14/732,550

(22) Filed: Jun. 5, 2015

(65) Prior Publication Data
US 2016/0007463 A1    Jan. 7, 2016

(30) Foreign Application Priority Data

Jul. 4, 2014  (KR) .................. 10-2014-0083834
Oct. 28, 2014  (KR) .................. 10-2014-0147111

(51) Int. Cl.
*H05K 1/18*    (2006.01)
*H05K 1/02*    (2006.01)
(Continued)

(52) U.S. Cl.
CPC .......... *H05K 3/284* (2013.01); *H05K 3/4007* (2013.01); *H01L 23/3121* (2013.01);
(Continued)

(58) Field of Classification Search
None
See application file for complete search history.

(56) References Cited

U.S. PATENT DOCUMENTS

| 8,139,368 B2 * | 3/2012 | Nomura | H01L 23/3677 174/260 |
| 2007/0026196 A1 * | 2/2007 | Ogawa | H01L 21/4857 428/157 |

(Continued)

FOREIGN PATENT DOCUMENTS

| CN | 103325760 A | 9/2013 |
| JP | 4840508 B2 | 12/2011 |

(Continued)

OTHER PUBLICATIONS

Chinese Office Action dated Jul. 4, 2017 in corresponding Chinese Patent Application No. 201510387300.4. (14 pages in English and 9 pages in Chinese).

(Continued)

*Primary Examiner* — Dimary S Lopez Cruz
(74) *Attorney, Agent, or Firm* — NSIP Law

(57) ABSTRACT

An electronic device module includes: a board including at least one mounting electrode and at least one external connection electrode and having a protective insulation layer which is provided on an outer surface thereof; at least one electronic device mounted on the mounting electrodes; a molded part sealing the electronic device; and at least one connective conductor of which one end is bonded to the external connection electrode of the board and which penetrates through the molded part to be disposed in the molded part, wherein the protective insulation layer is disposed to be spaced apart from the connective conductor.

18 Claims, 12 Drawing Sheets

(51) Int. Cl.
  *H05K 1/11* (2006.01)
  *H05K 3/28* (2006.01)
  *H05K 3/40* (2006.01)
  *H01L 23/31* (2006.01)
(52) U.S. Cl.
  CPC ............... *H01L 2224/16225* (2013.01); *H01L 2224/48091* (2013.01); *H01L 2924/181* (2013.01); *H01L 2924/19105* (2013.01); *H01L 2924/19106* (2013.01); *H05K 3/28* (2013.01); *H05K 2203/0723* (2013.01); *H05K 2203/1572* (2013.01)

(56) References Cited

U.S. PATENT DOCUMENTS

| | | | | |
|---|---|---|---|---|
| 2008/0307642 | A1* | 12/2008 | Kurashima | H01L 21/565 29/832 |
| 2010/0101836 | A1* | 4/2010 | Sekimoto | H05K 1/187 174/251 |
| 2010/0220448 | A1 | 9/2010 | Nomura | |
| 2013/0127025 | A1 | 5/2013 | Cho | |
| 2013/0249082 | A1* | 9/2013 | Chien | H01L 24/11 257/737 |
| 2014/0361663 | A1* | 12/2014 | Oikawa | H03H 9/1064 310/344 |

FOREIGN PATENT DOCUMENTS

| | | |
|---|---|---|
| JP | 2013-080756 A | 5/2013 |
| KR | 10-2009-0060483 A | 6/2009 |
| KR | 10-2013-0062967 A | 6/2013 |
| WO | WO 2013/099963 A1 | 7/2013 |

OTHER PUBLICATIONS

Korean Office Action dated May 11, 2018 in Corresponding Korean Patent Application No. 10-2014-0147111 (6 pages in English, 5 pages in Korean).

* cited by examiner

ELECTRONIC DEVICE MODULE AND METHOD OF MANUFACTURING THE SAME

CROSS-REFERENCE TO RELATED APPLICATIONS

This application claims benefit of priority to Korean Patent Applications No. 10-2014-0083834 filed on Jul. 4, 2014 and 10-2014-0147111 filed on Oct. 28, 2014, with the Korean Intellectual Property Office, the disclosures of which are incorporated herein by reference.

BACKGROUND

The present disclosure relates to an electronic device module including external terminals that may be disposed on an exterior surface of a molded part, and a method of manufacturing the same.

In order to realize the miniaturization and lightening of electronic devices, a system-on-chip (SOC) technology, a need exists for arranging a plurality of individual devices on a single chip, system-in-package (SIP) technology for integrating a plurality of individual devices in a single package, or the like, as well as technology for decreasing respective sizes of components mounted in electronic devices.

In addition, in order to manufacture an electronic device module having a small size and high performance, a structure in which electronic components are mounted on both surfaces of a board and a structure in which external terminals are formed on both surfaces of a package have been developed.

SUMMARY

An aspect of the present disclosure may provide an electronic device module having external terminals which are formed on a molded part of the module, and a manufacturing method thereof.

According to an aspect of the present disclosure, an electronic device module may include: aboard including at least one mounting electrode and at least one external connection electrode and having a protective insulation layer which is provided on an outer surface thereof; at least one electronic device mounted on the mounting electrodes; a molded part sealing the electronic device; and at least one connective conductor of which one end is bonded to the external connection electrode of the board and which penetrates through the molded part to be disposed in the molded part, wherein the protective insulation layer is disposed to be spaced apart from the connective conductor.

According to another aspect of the present disclosure, a method of manufacturing an electronic device module may include: preparing a board including at least one mounting electrode and at least one external connection electrode and having a protective insulation layer which is formed on an outer surface of the board; mounting at least one electronic device on the mounting electrode; forming a molded part sealing the electronic device; forming at least one via hole in the molded part without exposing the protective insulation layer; and forming at least one connective conductor in the via hole by using a plating method.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
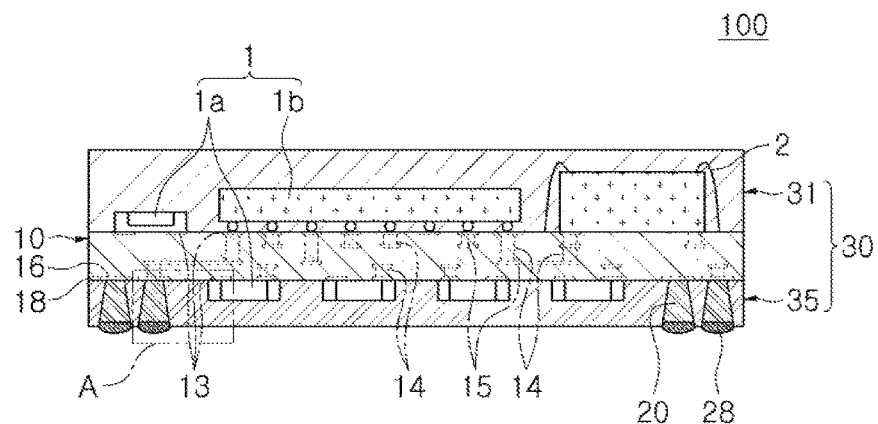
FIG. 1 is a cross-sectional view schematically illustrating an electronic device module according to an exemplary embodiment in the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view schematically illustrating an electronic device module according to an exemplary embodiment in the present disclosure. In addition, FIG. 2 is a partially cut-away perspective view illustrating an inner portion of the electronic device module illustrated in FIG. 1; and FIG. 3 is a partially enlarged cross-sectional view of part A of FIG. 1.

Figure 2:
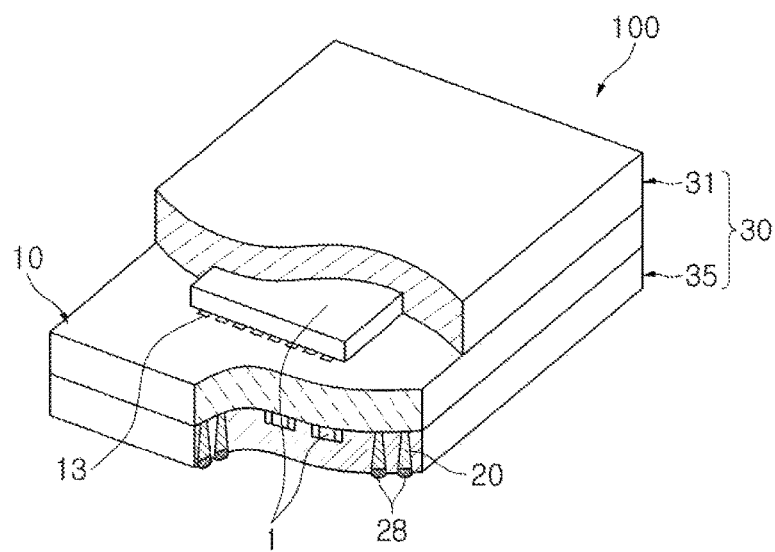
FIG. 2 is a partially cut-away perspective view illustrating an inner portion of the electronic device module illustrated in FIG. 1.
Figure 3:
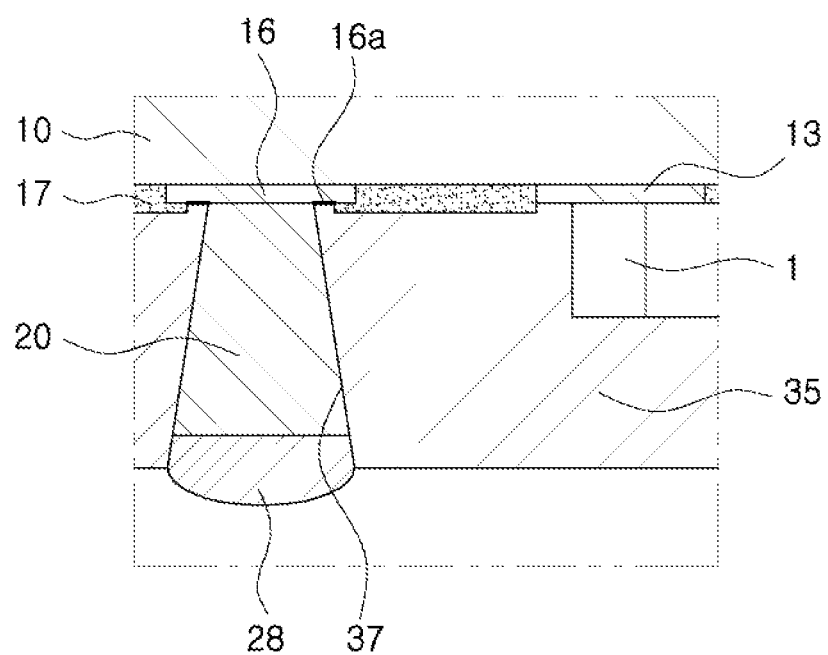
FIG. 3 is a partially enlarged cross-sectional view of part A of FIG. 1.

Referring to FIGS. 1 through 3, an electronic device module 100 according to the present exemplary embodiment may include electronic devices 1, a board 10, a molded part 30, connective conductors 20, and external terminals 28.

The electronic devices 1 may include various devices such as a passive device 1a and an active device 1b and may be any electronic devices 1 that may be mounted on the board.

The electronic devices 1 may be mounted on one surface or both surfaces of a board 10 as described below. A case in which both of the active device 1b and the passive device 1a are mounted on an upper surface of the board 10 and only the passive device 1a is mounted on a lower surface of the board 10 has been illustrated by way of example in FIG. 1. However, the present inventive concept is not limited thereto. That is, the electronic devices 1 may be disposed in various forms on both surfaces of the board 10 depending on sizes or forms thereof and a design of the electronic device module 100.

The electronic devices 1 may be mounted in a flip-chip form on the board 10 or be electrically bonded to the board 10 through bonding wires 2.

As the board 10, various kinds of boards (for example, a ceramic board, a printed circuit board (PCB), a flexible board, and the like) well known in the art may be used. In addition, the board 10 may have one or more electronic devices 1 mounted on at least one surface thereof.

The board 10 may have a plurality of electrodes 13 and 16 formed on one surface or both surfaces thereof. Here, the electrodes may include a plurality of mounting electrodes 13 for mounting the electronic devices 1 thereon and a plurality of external connection electrodes 16 to which the external terminals 28 are electrically connected. The external connection electrodes 16 may be provided in order to be electrically connected to connective conductors 20 to be described below and may be connected to the external terminals 28 through the connective conductors 20.

In addition, although not illustrated, the board 10 may have wiring patterns formed on both surfaces thereof in order to electrically connect the mounting electrodes 13 or the external connection electrodes 16 to each other.

The board 10 according to the present exemplary embodiment described above may be a multilayer board including a plurality of layers, and circuit patterns 15 for forming electrical connection may be formed between the plurality of layers.

In addition, the board 10 according to the present exemplary embodiment may include conductive vias 14 electrically connecting the electrodes 13 and 16 and the circuit patterns 15 formed in the board 10 to each other.

Meanwhile, the board 10 may have electroplating wirings 18, as illustrated in FIG. 1, formed on at least one surface thereof. The electroplating wirings may be used in a process of forming connective conductors 20 to be described below by electroplating.

The board 10 according to the present exemplary embodiment described above may be a board in which a plurality of same mounting regions are repeatedly disposed in order to simultaneously manufacture a plurality of individual modules. In detail, the board 10 according to the present exemplary embodiment may be a board having a rectangular form having a wide area and having a long strip shape. In this case, the electronic device modules may be manufactured for each of a plurality of individual module mounting regions.

The molded part 30 may include a first molded part 31 formed on the upper surface of the board 10 and a second molded part 35 formed on the lower surface of the board 10.

The molded part 30 may seal the electronic devices 1 mounted on both surfaces of the board 10. In addition, the molded part 30 may be filled between the electronic devices 1 mounted on the board 10 to prevent an electrical short-circuit from occurring between the electronic devices 1, and may fix the electronic devices 1 onto the board while enclosing outer portions of the electronic devices 1, thereby safely protecting the electronic devices 1 from external impact.

The molded part 30 according to the present exemplary embodiment may be formed of an insulating material including a resin such as an epoxy molding compound (EMC). However, the present inventive concept is not limited thereto.

The first molded part 31 according to the present exemplary embodiment may be formed in a form in which it entirely covers one surface of the board 10. In addition, a case in which all of the electronic devices 1 are embedded in the first molded part 31 has been described by way of example in the present exemplary embodiment. However, the present inventive concept is not limited thereto, but may be variously applied. For example, at least one of the electronic devices 1 embedded in the first molded part 31 may be configured to be partially exposed to the exterior of the first molded part 31.

The second molded part 35 may be formed on the lower surface of the board 10 and may have the connective conductors 20 formed therein.

The second molded part 35 may be formed in a form in which it allows all of the electronic devices 1 to be embedded therein, similar to the first molded part 31. Alternatively, the second molded part 35 may also be formed in a form in which some of the electronic devices 1 are exposed externally.

The connective conductor 20 may be disposed in a form in which it is bonded to at least one surface of the board 10, and may have one end bonded to the board 10 and the other end exposed to the exterior of the molded part 30 to thereby be connected to the external terminal 28. Therefore, the connective conductor 20 may be formed in the molded part 30 in a form in which it penetrates through the molded part 30.

The connective conductor 20 may be formed of a conductive material, for example, copper, gold, silver, aluminum, or an alloy thereof.

The connective conductor 20 according to the present exemplary embodiment may be formed of the same material as that of the electrodes 13 and 16. In detail, the connective conductor 20 may be formed of the same material as that of the external connection electrode 16 to which it is connected.

Therefore, in a case in which the external connection electrode 16 is formed of copper (Cu), the connective conductor 20 may also be formed of copper (Cu), such that the connective conductor 20 and the external connection electrode 16 may be formed integrally with each other using the same material.

The connective conductor 20 according to the present exemplary embodiment may be formed in a form similar to a conical form in which a horizontal cross-sectional area thereof becomes small toward one end thereof, that is, toward the board 10. However, a form of the connective conductor 20 is not limited thereto, but may be variously changed as long as a horizontal cross-sectional area of the connective conductor 20 close to the board 10 is smaller than that of the connective conductor 20 close to an outer surface of the molded part 30.

The other end of the connective conductor 20 may be formed to have a concave shape inside of a via hole 37, as illustrated in FIG. 3. In addition, a portion of the external terminal 28 may be introduced into a via hole 37 to thereby be filled in a remaining space of the via hole 37.

In this case, since the portion of the external terminal 28 is inserted into the via hole 37 in a protrusion form, coupling force between the external terminal 28 and the connective conductor 20 or the molded part 30 may be increased.

However, the configuration of the present inventive concept is not limited thereto, but may be variously modified. For example, the other end of the connective conductor 20 may protrude to be convex outwardly of the board 10 or be formed in a flat shape in which it is in parallel with one surface of the board 10.

The external terminal 28 is bonded to the other end of the connective conductor 20. The external terminal 28 may electrically and physically connect the electronic device module 100 and a main board (not illustrated) on which the electronic device module 100 is mounted to each other. The external terminal 28 may be formed in a pad form, but is not limited thereto. That is, the external terminal 28 may be formed in various forms such as a bump form, a solder ball form, and the like.

A case in which the connective conductors 20 are formed in only the second molded part 35 has been described by way of example in the present exemplary embodiment. However, the configuration of the present inventive concept is not limited thereto. That is, the connective conductors 20 may also be formed in the first molded part 35, if necessary.

The electronic device module 100 according to the present exemplary embodiment configured as described above may include protective insulation layers 17 formed on surfaces of the board 10, as illustrated in FIG. 3. The protective insulation layers 17 may be formed on one surface or both surfaces of the board 10 and may protect wiring patterns (not illustrated) formed on the board 10 while covering the wiring patterns.

The protective insulation layer 17 may be formed of a solder resist layer.

In addition, the protective insulation layer 17 may partially cover the electrodes 13 and 16 formed on the board 10. In more detail, the protective insulation layer 17 may cover outer side portions of the external connection electrodes 16 according to the present exemplary embodiment that are not bonded to the connective conductors 20.

For example, the protective insulation layer 17 may cover edge portions of the external connection electrodes 16. Here, the protective insulation layer 17 does not contact the connective conductors 20, but may be formed at a position spaced apart from the connective conductors 20 by a predetermined distance. Therefore, in a case in which the second molded part 35 is omitted, the external connection electrodes 16 may be partially exposed between the protective insulation layer 17 and the connective conductors 20.

In addition, the second molded part 35 according to the present exemplary embodiment may be disposed in a form in which it covers the protective insulation layer 17 formed on the external connection electrodes 16.

Therefore, the protective insulation layer 17 formed on the external connection electrodes 16 may be completely embedded in the second molded part 35, and the second molded part 35 may also be filled between the protective insulation layer 17 and the connective conductors 20.

Therefore, as illustrated in FIG. 3, the connective conductors 20 do not contact portions of the protective insulation layer 17 in which they are bonded to the external connection electrodes 16, but may contact only the second molded part 35.

This configuration may be obtained by forming grooves 17a (See FIG. 4A) in the protective insulation layer 17 formed on the external connection electrodes 16 in a process of manufacturing the board, forming the molded part 30 in the grooves 17a, and then forming the connective conductors 20. This will be detailed below in a description for a method of manufacturing an electronic device module.

Next, a method of manufacturing an electronic device module according to the present exemplary embodiment will be described.

FIGS. 4A through 4H are cross-sectional views illustrating a method of manufacturing the electronic device module illustrated in FIG. 1.

Figure 4A:
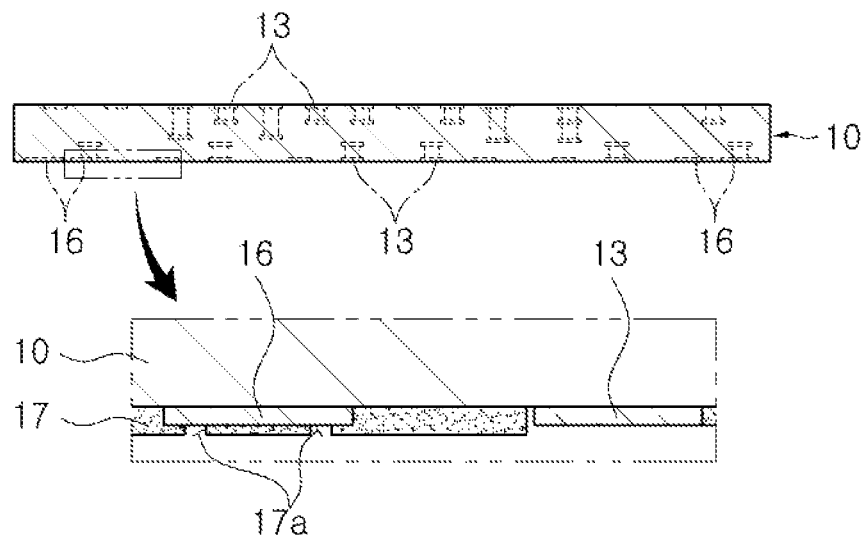
FIGS. 4A through 4H are cross-sectional views illustrating a method of manufacturing the electronic device module illustrated in FIG. 1.

Referring to FIGS. 4A through 4H, first, as illustrated in FIG. 4A, an operation of preparing the board 10 may be performed. As described above, the board 10 may be a multilayer board, and may have the mounting electrodes 13 formed on both surfaces thereof. In addition, the board 10 may have the external connection electrodes 16 formed on the lower surface thereof.

Further, the board 10 according to the present exemplary embodiment may have the protective insulation layers 17 formed on one surface or both surfaces thereof. The protective insulation layer 17 may be formed while covering the wiring patterns formed on the board 10, as described above. In addition, the electrodes 13 and 16 may be completely embedded in the protective insulation layer 17 or be exposed.

In detail, most of the mounting electrodes 13 on which the electronic devices 1 are mounted may be exposed to the exterior of the protective insulation layer 17. Here, a nickel/gold (Ni/Au) plating layer (not illustrated) may be formed on exposed surfaces of the mounting electrodes 13 in order to prevent oxide films from being formed on the exposed surfaces.

On the other hand, most of the external connection electrodes 16 may be embedded in the protective insulation layer 17, and be only partially exposed externally by the grooves 17a formed in the protective insulation layer 17.

Here, a nickel/gold (Ni/Au) plating layer may not be formed on exposed portions of the external connection electrodes 16. Therefore, insulation films 16a (See FIG. 4B) such as oxide films may be formed on exposed surfaces of the external connection electrodes 16 depending on an exposure environment or an exposure time.

In the present exemplary embodiment, the groove 17a formed in the protective insulation layer 17 may be formed in a ring shape smaller than an area of the external connection electrode 16 to correspond to a shape of the electrode 16. In more detail, an outer contour line (for example, an outer diameter) of the groove 17a may be spaced apart from an outer contour line of the external connection electrode 16 by a predetermined distance.

However, the present inventive concept is not limited thereto. That is, the outer contour line of the groove 17a may be the same as that of the external connection electrode 16 or the outer contour line of the groove 17a may be larger than that of the external connection electrode 16, if necessary. However, an inner contour line of the groove 17a may be smaller than the outer contour line of the external connection electrode 16. The groove 17a may be formed in a process of forming the protective insulation layer 17 on the board 10. However, the present inventive concept is not limited thereto. That is, the groove 17a may also be formed by forming the protective insulation layer 17 completely covering the external connection electrode 16 and the mounting electrode 13 and then removing portions of the mounting electrode 13, if necessary.

Figure 4B:
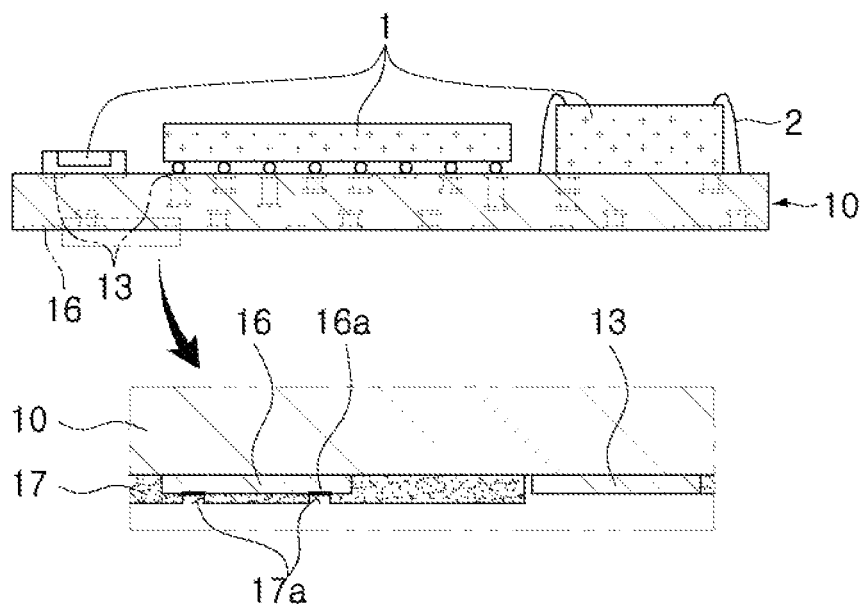

Then, as illustrated in FIG. 4B, an operation of mounting the electronic devices 1 on one surface, that is, the upper surface, of the board 10 may be performed. The present operation may be performed by printing solder pastes on the mounting electrodes 13 formed on one surface of the board 10 in a screen printing scheme, or the like, seating the electronic devices 1 on the solder pastes, and then applying heat by a reflow process to melt and harden the solder pastes.

However, the present operation is not limited thereto, but may be performed by seating the electronic devices 1 on one surface of the board 10 and then electrically connecting the mounting electrodes 13 formed on the board 10 and electrodes of the electronic devices 1 to each other using the bonding wires 2.

Meanwhile, in this process, the insulation films 16a may be formed on surfaces of the external connection electrode 16 of the board 10 exposed through the grooves of the protective insulation layer 17, by the heat applied in the reflow process.

Figure 4C:
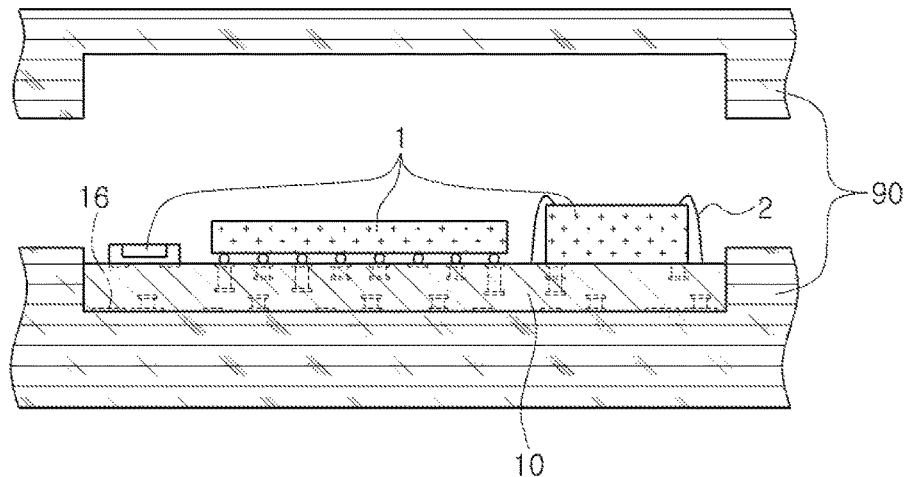

Then, an operation of forming the first molded part 31 on one surface of the board 10 may be performed. In the present operation, as illustrated in FIG. 4C, the board 10 on which the electronic devices 1 are mounted may be first disposed in a mold 90.

Figure 4D:
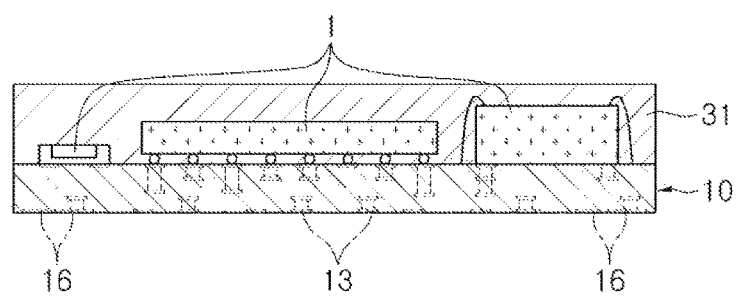

Then, a molding resin may be injected into the mold 90 to form the first molded part 31 as illustrated in FIG. 4D. Therefore, the electronic devices 1 mounted on one surface, that is, the upper surface, of the board 10 may be protected from an external environment by the first molded part 31.

Figure 4E:
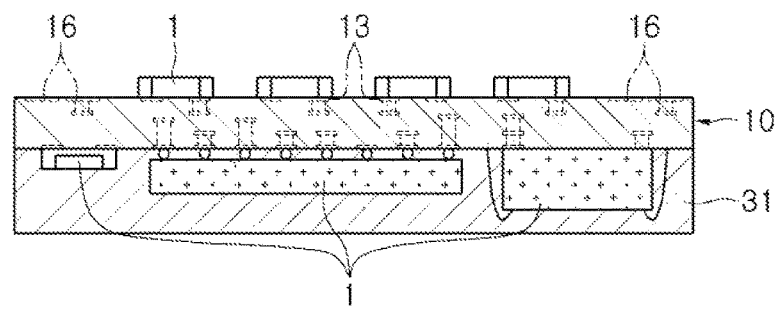

Then, as illustrated in FIG. 4E, an operation of mounting the electronic devices 1 on the lower surface of the board 10 may be performed. The present operation may be performed by printing solder pastes on the mounting electrodes 13 in a screen printing scheme, or the like, seating the electronic devices 1 on the solder pastes, and then applying heat by a reflow process to melt and harden the solder pastes.

Figure 4F:
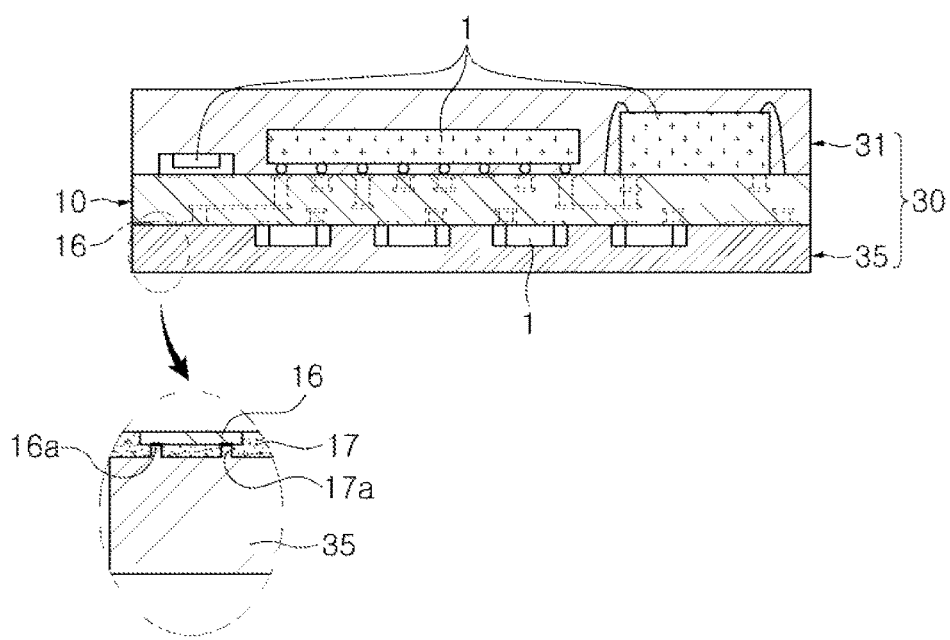

Next, as illustrated in FIG. 4F, an operation of forming the second molded part 35 beneath the board 10 may be performed. The present operation may be performed by disposing the board 10 in the mold 90 (See FIG. 4C) and then injecting a molding resin into the mold 90, as in a case illustrated in FIG. 4C.

In the process, the molding resin forming the molded part 30 may be introduced into the grooves 17a formed in the protective insulation layer 17 to thereby be filled in the grooves 17a. Therefore, the molded part 30 may contact the external connection electrodes 16 through the grooves 17a.

Meanwhile, the insulation films (for example, the oxide films) 16a may be formed on the external connection electrodes 16 exposed externally through the grooves 17a of the protective insulation layer 17. Therefore, the molding resin (for example, an EMC) forming the molded part 30 may be bonded to the insulation films 16a while contacting the insulation films 16a without directly contacting the external connection electrodes 16. Therefore, the molded part 30 may be more firmly bonded to the external connection electrodes 16 as compared with a case in which the molded part 30 is directly bonded to a metal such as copper (Cu) or a conductor.

Then, an operation of forming the connective conductors 20 may be performed.

Figure 4G:
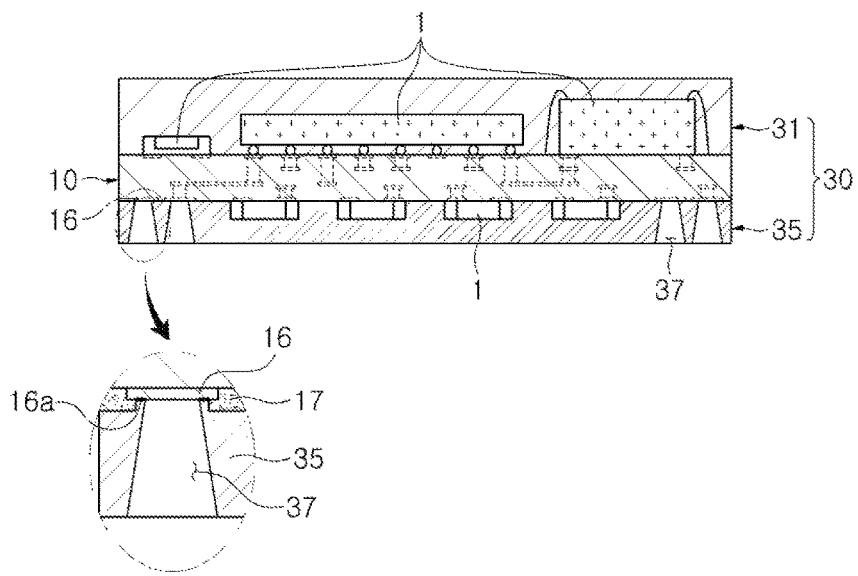

First, as illustrated in FIG. 4G, via holes 37 may be formed in the second molded part 35. The via holes 37 may be formed using a laser drill.

The via hole 37 may generally have a conical form in which a horizontal cross-sectional area thereof becomes small toward the board 10.

In addition, the via holes 37 formed in the grooves of the protective insulation layer 17 may be formed along the grooves 17a formed in the protective insulation layer 17.

The via hole 37 may have a cross-sectional area (or diameter) smaller than an area (or diameter) formed by an outer circumference of the groove 17a inside the protective insulation layer 17. In addition, the via hole 37 may have a cross-sectional area larger than an area formed by an outer circumference of the groove 17a outside the protective insulation layer 17.

Therefore, in the method of manufacturing an electronic device module, the via holes 37 may be formed by irradiating only the molded part 30 with laser without irradiating the protective insulation layer 17 with the laser. Therefore, an inner surface of the via hole 37 may be entirely formed of the same material (for example, the EMC), such that the inner surface of the via hole 37 may be entirely uniformly formed.

Meanwhile, in a case in which the protective insulation layer 17 is irradiated with the laser due to partial exposure of the protective insulation layer 17 in the molded part 30, the protective insulation layer 17 may be delaminated from the external connection electrode 16 due to thermal impact, or the like, caused by the laser irradiation. In this case, a delaminated portion may act as a factor hindering plating in a plating process.

However, in a case in which the molded part 30 is more firmly bonded to the external connection electrodes 16 through the insulation films 16a and only the molded parts 30 is removed via the laser as in the present exemplary embodiment, the protective insulation layer 17 is not irradiated with the laser, such that the above-mentioned problem may be solved.

Here, although the protective insulation layer 17 disposed at the center of the groove 17a may be irradiated with the laser, since the protective insulation layer 17 disposed at the center of the groove 17a is completely removed, the above-mentioned delamination problem may not arise in the protective insulation layer 17 disposed at the center of the groove 17a.

Figure 4H:
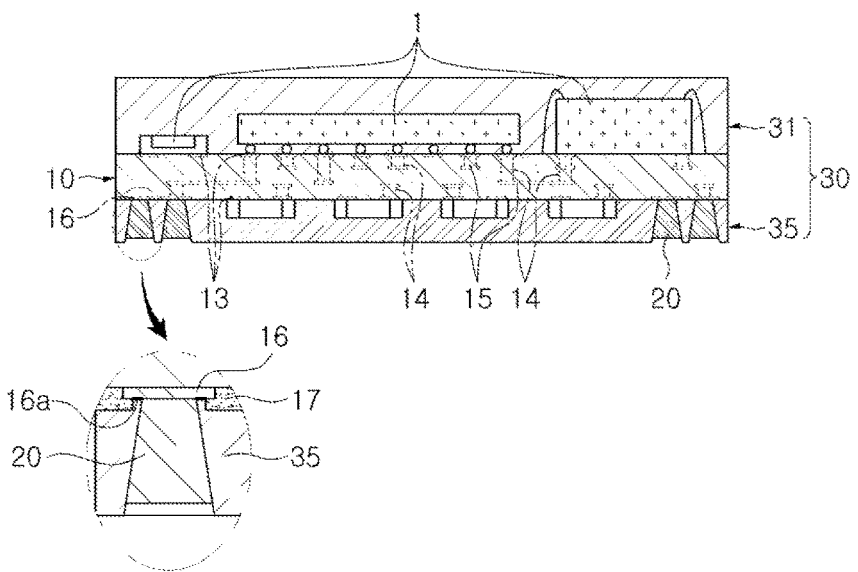

Then, conductive materials may be filled in the via holes 37 to form the connective conductors 20 as illustrated in FIG. 4H.

The connective conductors 20 according to the present exemplary embodiment may be formed through plating process. In a case in which the connective conductor 20 is formed of copper (Cu), copper plating may be performed.

Here, the plating process may be implemented with only electroplating. In this case, the via holes 37 may be sequentially filled with the conductive materials from the external connection electrodes 16 of the board 10 using electroplating wirings (not illustrated) formed on the board 10 to form the connective conductors 20. However, the present inventive concept is not limited thereto. That is, electroless plating may also be used, if necessary.

Meanwhile, as described above, the molded part 30 according to the present exemplary embodiment may be formed of the epoxy mold compound (EMC). Generally, it has been known that it is not easy to perform plating on a surface of the EMC, which is a thermosetting resin, that is, to bond a metal to the surface of the EMC.

Therefore, in the method of manufacturing an electronic device module according to the present exemplary embodiment, a mechanical interlocking, hooking, and anchoring theory or an anchoring effect may be used in order to plate a conductor on the surface of the EMC. The mechanical interlocking, hooking, and anchoring theory may mean a theory in which an adhesive permeates into an irregular structure (ruggedness) of a surface of a material to be adhered to thereby be bonded thereto by mechanical engagement.

That is, in the method of manufacturing an electronic device module according to the present exemplary embodiment, a method of forming an inner surface of the via hole 37 formed of the EMC as roughly as possible and coupling the plating material to the inner surface of the via hole 37 by the anchoring effect in the plating process may be used.

To this end, in the present exemplary embodiment, a surface roughness of the inner surface of the via hole 37 may be increased as much as possible in a process of forming the via hole 37 using laser, thereby forming an irregular surface structure. Here, the surface roughness may be increased by adjusting a kind of laser, a size of a spot of the laser, power of the laser.

Therefore, even though the molded part 30 is formed of the EMC, heterogeneous interfaces of the connective conductor 20 and the inner surface of the via hole 37 may be easily bonded to each other.

Meanwhile, various modifications may be made in order to increase coupling force between the connective conductor 20 and the molded part 30. For example, substantial copper plating may be performed after a catalyst metal such as gold, platinum, palladium, or the like, is disposed in a plating target region.

In addition, in order to significantly decrease an influence of impact generated in the external connection electrode 16 due to the laser irradiation, the external connection electrode 16 exposed into the via hole 37 may be partially etched.

In addition, the present inventive concept is not limited to the above-mentioned method, but may be variously modified. For example, after the connective conductors 20 are partially formed in the via holes 37 in a plating scheme, conductive pastes may be applied in a screen printing scheme to complete the connective conductors 20 while being completely filled in the via holes 37.

When the connective conductors 20 are formed by the process as described above, the external terminals 28 may be formed at the other ends of the connective conductors 20 to complete the electronic device module 100 according to the present exemplary embodiment illustrated in FIG. 1.

Here, the external terminals 28 may be formed in various forms such as a bump form, a solder ball form, or the like, rather than a pad form.

In addition, as described above, since heat impact is not applied to the protective insulation layer 17 in the process of forming the via hole 37, the inner surface of the via hole 27 may be formed of only a material of the molded part 30.

Therefore, even though the connective conductors 20 are formed while being sequentially filled in the via holes 37 from the external connection electrodes 16, the protective insulation layer 17 may not be delaminated from the external connection electrodes 16. However, the present inventive concept is not limited thereto. That is, electroless plating may also be used, if necessary.

Meanwhile, in the case in which the protective insulation layer 17 is irradiated with the laser due to the partial exposure of the protective insulation layer 17 in the molded part 30, the protective insulation layer 17 may be delaminated from the external connection electrode 16 due to the thermal impact, or the like, caused by the laser irradiation. In this case, the delaminated portion may act as the factor hindering plating in the plating process.

In the electronic device module 100 according to the present exemplary embodiment manufactured through the above-mentioned operations, the electronic devices 1 may be mounted on both surfaces of the board 10 and be sealed by the molded part 30. Therefore, many devices may be mounted in one electronic device module 100 and be easily protected from the external environment.

In addition, the connective conductors 20 may be formed in the molded part 30 in the plating scheme and be connected to the external terminals 28. Therefore, conductor paths and circuit wirings connecting the board 10 and the external power source to each other may be very easily formed even in a double-sided molding structure or a package stack structure, such that the electronic device module may be easily manufactured.

Meanwhile, according to the related art, in a case in which the external terminal is directly formed on the external connection electrode 16 formed of copper (Cu), after an exposed surface of the external connection electrode 16 was plated with nickel (Ni) or gold (Au) to form an under bump metallization (UBM), the external terminal 28 was bonded onto the UBM.

This is to prevent the exposed external connection electrode 16 from being oxidized due to heat applied to the external connection electrode 16 in a reflow process for mounting the devices, or the like.

However, in the method of manufacturing an electronic device module according to the present exemplary embodiment, the external terminals 28 are not directly formed on the board 10, but may be formed on the molded part 30 through the connective conductors 20.

In more detail, in a state in which the external connection electrodes 16 of the board 10 are covered by the protective insulation layer 17, the electronic devices may be mounted and the molded part 30 may be formed, and the via holes 37 may be in the molded part 30, and the connective conductors 20 may be formed.

Therefore, since a period during which the external connection electrodes 16 are exposed externally is short and the reflow process is not performed after the external connection electrodes 16 are exposed externally, heat having a high temperature may not be applied to the external connection electrodes 16. Therefore, even though the UBM is not formed on the external connection electrodes 16 as in the related art, the external connection electrodes 16 may not be easily oxidized. Therefore, since a process of forming the UBM may be omitted, the electronic device module may be very easily manufactured.

Due to the method of manufacturing an electronic device module as described above, in the electronic device module 100 according to the present exemplary embodiment, the connective conductor 20 formed of the copper may be directly bonded to the external connection electrode 16 formed of the copper. That is, the external connection electrode 16 and the connective conductor 20 according to the present exemplary embodiment may be formed integrally with each other by the same metal (for example, copper) without having a heterogeneous metal such as the UBM interposed on a bonded surface therebetween.

Therefore, since an interface formed of the heterogeneous metal is not present between the external connection electrode 16 and the connective conductor 20, reliability of bonding between the external connection electrode 16 and the connective conductor 20 may be secured.

In addition, in the method of manufacturing an electronic device module according to the present exemplary embodiment, before the molded part 30 is formed, the groove 17a may be partially formed in the protective insulation layer 17 and the insulation film 16a may be formed on the external connection electrode exposed through the groove 17a.

In addition, the molded part 30 may be bonded to the external connection electrode 16 through the insulation film 16a. Therefore, a bonding force between the molded part 30 and the external connection electrode 16 may be increased, such that the molded part 30 may be very firmly bonded to the external connection electrode 16.

In addition, since the via hole 37 is formed in the molded part 30 after the molded part 30 is filled in the groove 17a, the protective insulation layer 17 may not be exposed to the inner surface of the via hole 37, and the inner surface of the via hole 37 may be formed of only the molded part 30. Therefore, the delamination of the protective insulation layer 17 from the external connection electrode 16 due to the laser irradiated to the protective insulation layer 17 in a laser drilling process may be prevented.

The connective conductor according to the present exemplary embodiment may be grown and formed from the external connection electrode 16 through the electroplating. Therefore, in a case in which the protective insulation layer 17 in the via hole 37 is exposed and is partially delaminated from the external connection electrode 16, the delaminated protective insulation layer 17 may hinder the growth of the connective conductor 20, such that it is difficult for the connective conductor to be normally formed.

However, as described above, in the method of manufacturing an electronic device module according to the present exemplary embodiment, since the inner surface of the via hole 37 is formed of only the molded part 30, the above-mentioned problem may be completely solved. Therefore, reliability of plating may be secured.

Meanwhile, although a case in which the second molded part 35 is formed after the first molded part 31 is formed has been described by way of example in the present exemplary embodiment, the present inventive concept is not limited thereto, but may be variously applied. For example, the second molded part 35 may be first formed, or the first and second molded parts 31 and 35 may be simultaneously formed.

Figure 5:
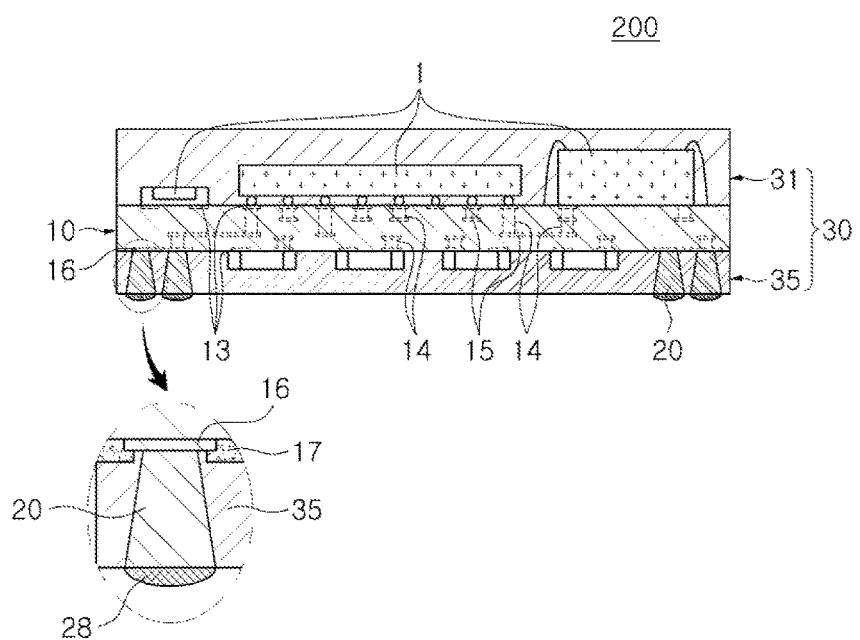
FIG. 5 is a cross-sectional view schematically illustrating an electronic device module according to another exemplary embodiment in the present disclosure.

FIG. 5 is a cross-sectional view schematically illustrating an electronic device module according to another exemplary embodiment in the present disclosure.

Referring to FIG. 5, in an electronic device module 200 according to the present exemplary embodiment, the connective conductors 20 may be completely filled in the via holes 37. In addition, the external terminals 28 may be bonded to the other ends of the connective conductors 20.

In this case, a bonded surface between the external terminal 28 and the connective conductor 20 may be coplanar with an outer surface of the second molded part 35.

As described above, the connective conductor 20 according to the present exemplary embodiment may be modified in various forms.

Figure 6A:
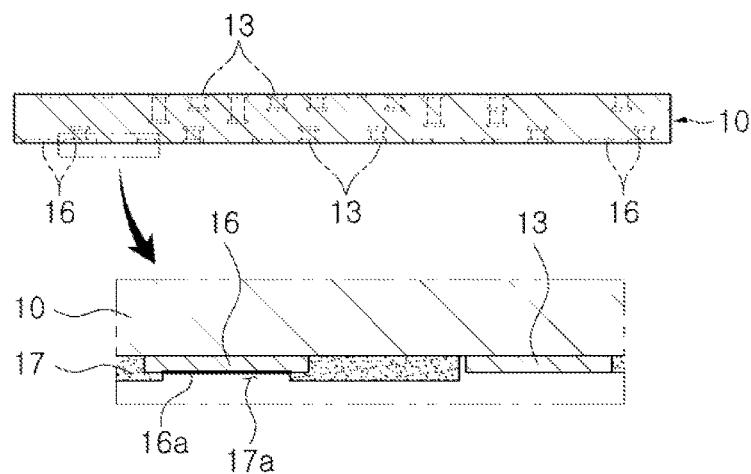
FIGS. 6A to 6C are views illustrating a method of manufacturing an electronic device module according to another exemplary embodiment in the present disclosure.
Figure 6B:
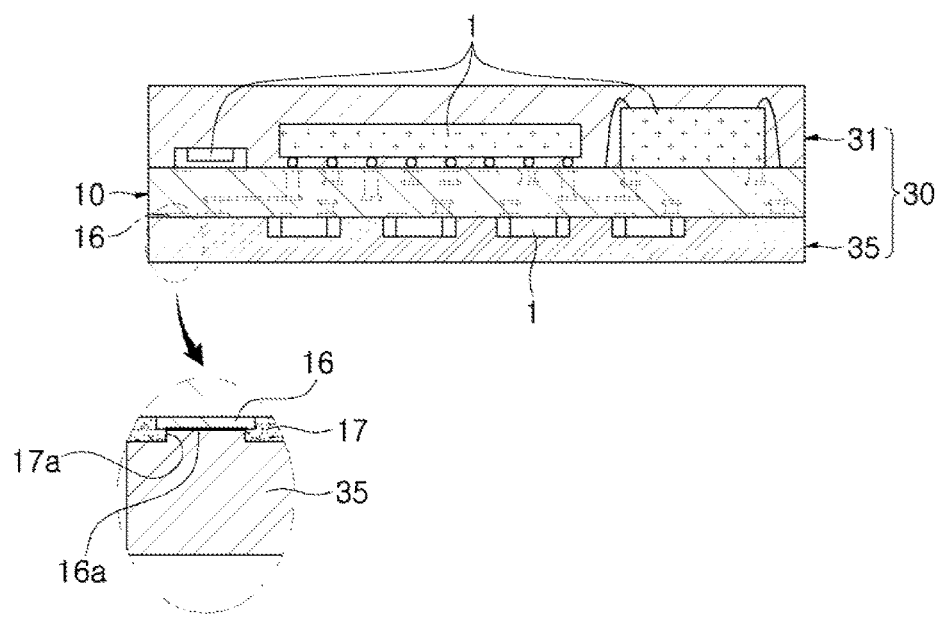
Figure 6C:
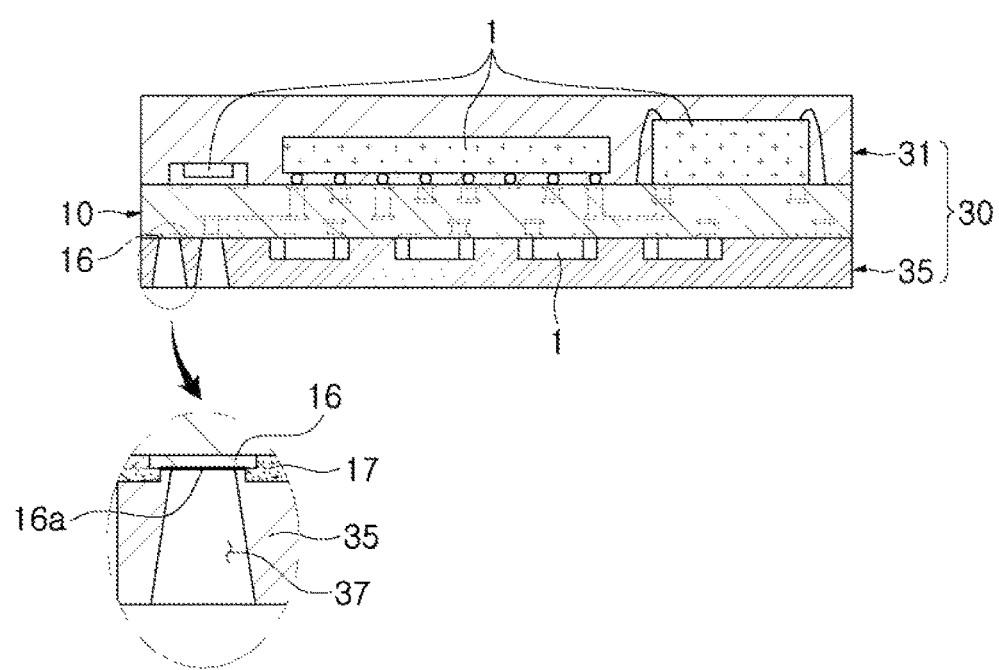

FIGS. 6A to 6C are views illustrating a method of manufacturing an electronic device module according to another exemplary embodiment in the present disclosure, wherein FIG. 6A illustrates an operation corresponding to FIG. 4A, FIG. 6B illustrates an operation corresponding to FIG. 4F, and FIG. 6C illustrates an operation of FIG. 4G.

The method of manufacturing an electronic device module according to the present exemplary embodiment is similar to the method of manufacturing an electronic device module according to the above-mentioned exemplary embodiment in the present disclosure except for a shape of the groove 17a formed in the protective insulation layer 17 and the groove forming method.

First, referring to FIG. 6A, in the method of manufacturing an electronic device module according to the present exemplary embodiment, the grooves 17a formed in the protective insulation layer 17 may be formed in a cylindrical shape or an opening shape rather than the ring shape. In this case, since most of the external connection electrode 16 is exposed externally, the insulation film 16a may be formed over an entire exposed surface of the external connection electrode 16 in a manufacturing process.

Here, the groove 17a formed in the protective insulation layer 17 and having the cylindrical shape may be formed in a process of manufacturing the protective insulation layer 17. In addition, the groove 17a may also be formed by forming the protective insulation layer 17 and performing a laser processing process, an etching process, or the like, on the protective insulation layer 17.

Then, after the operations illustrated in FIGS. 4B to 4E are performed, an operation of forming the molded part 30 may be performed, as illustrated in FIG. 6B. Here, the second molded part 35 may be filled in the grooves 17a formed in the protective insulation layer 17. In addition, the molded part 30 may be firmly bonded to the external connection electrode 16 through the insulation film 16a.

Then, the via holes 37 may be formed, as illustrated in FIG. 6C. The via holes 37 may be formed through the laser drill as in the above-mentioned exemplary embodiment.

Then, surfaces of the external connection electrodes 16 exposed into the via holes 37 may be etched to remove the insulation film 16a. Therefore, a structure illustrated in FIG. 4G may be completed.

Then, after the connective conductors 20 are formed in an electroplating scheme as illustrated in FIG. 4H, the external terminals 28 may be formed at distal ends of the connective conductors 20 to manufacture the electronic device module 100 illustrated in FIG. 1.

Figure 7:
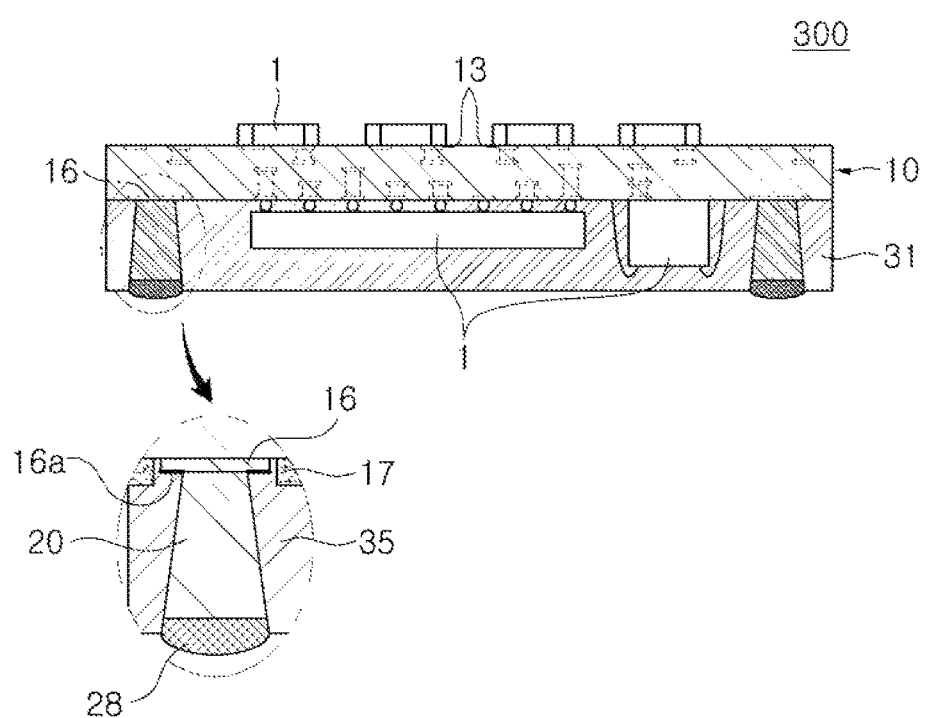
FIG. 7 is a cross-sectional view schematically illustrating an electronic device module according to another exemplary embodiment in the present disclosure.

FIG. 7 is a cross-sectional view schematically illustrated an electronic device module according to another exemplary embodiment in the present disclosure.

Referring to FIG. 7, an electronic device module 300 according to the present exemplary embodiment may be similar to the electronic device module 100 illustrated in FIG. 1 except that the molded part 31 is formed on only one surface of the board 10. In this case, since only one molded part 31 is formed, the number of manufacturing processes and a manufacturing cost may be decreased.

In addition, in the present exemplary embodiment, the protective insulation layer 17 may be disposed spaced apart from the external connection electrodes 16 by a predetermined distance without covering or contacting the external connection electrodes 16. Therefore, the external connection electrodes 16 may be completely exposed to the exterior of the protective insulation layer 17.

Figure 8A:
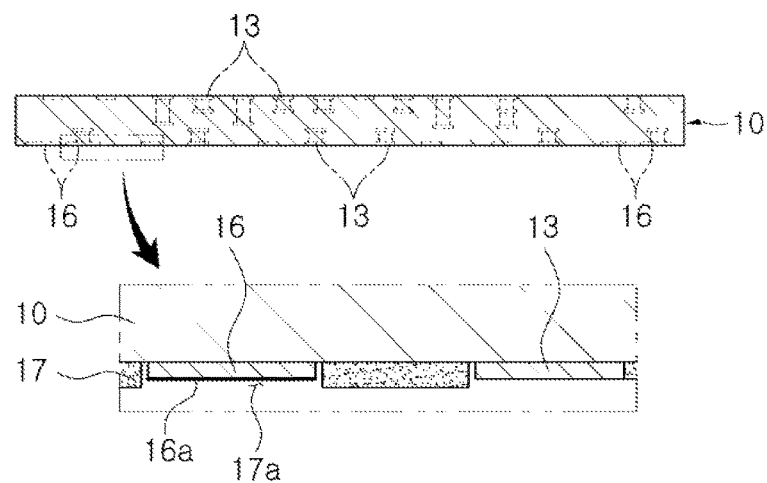
FIGS. 8A to 8C are views illustrating a method of manufacturing an electronic device module according to another exemplary embodiment in the present disclosure.
Figure 8B:
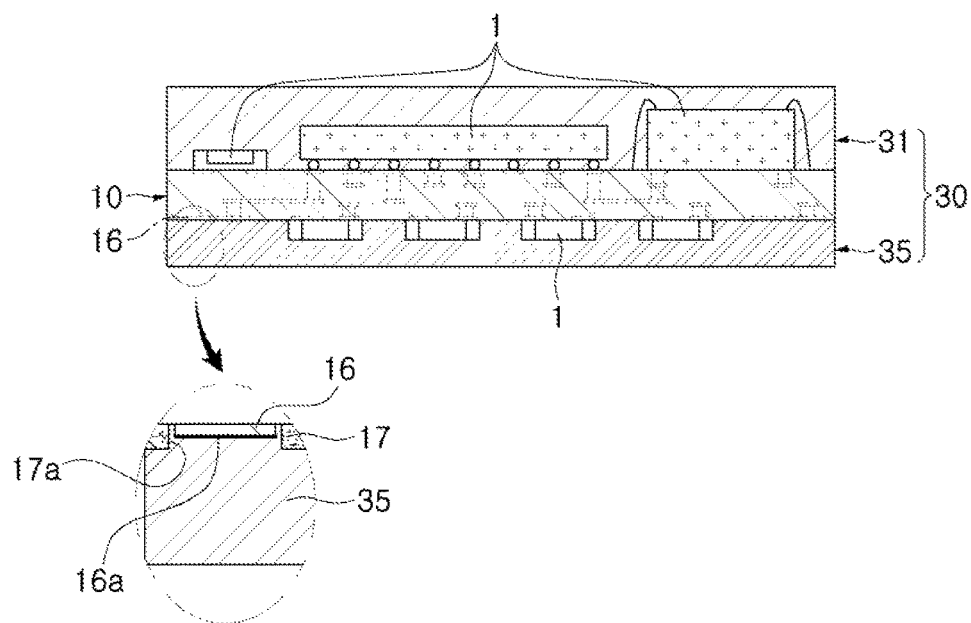

This structure may be manufactured by a method illustrated in FIGS. 8A and 8B.

Figure 8C:
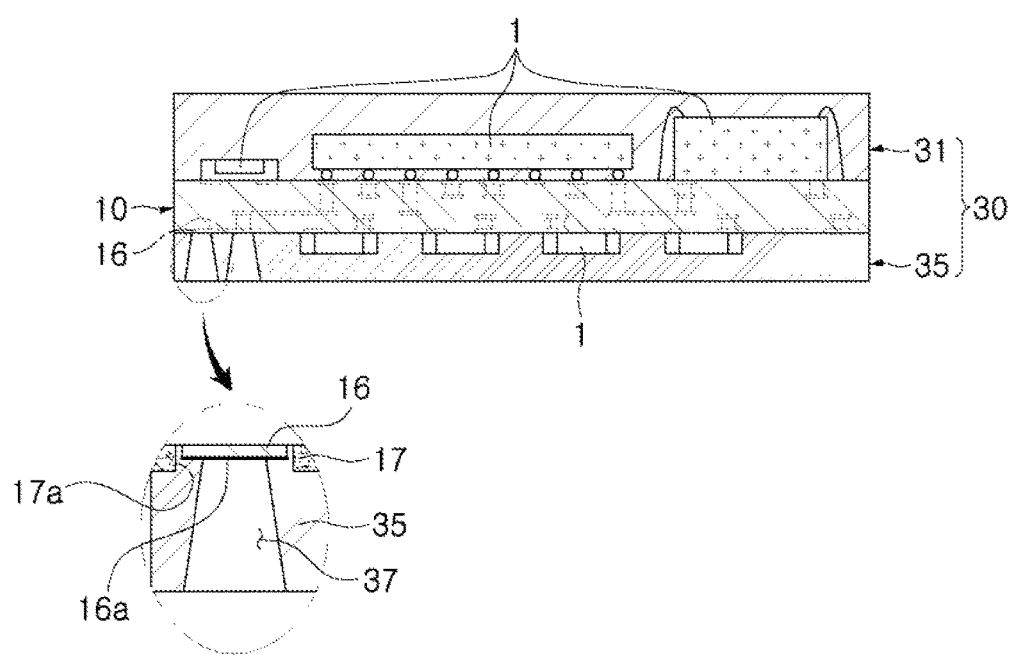

FIGS. 8A to 8C are views illustrating a method of manufacturing a structure of a connection terminal illustrated in FIG. 7 in a method of manufacturing an electronic device module according to another exemplary embodiment in the present disclosure.

First, referring to FIG. 8A, in the method of manufacturing an electronic device module according to the present exemplary embodiment, the grooves 17a formed in the protective insulation layer 17 may be formed in a cylindrical shape or an opening shape rather than the ring shape, as in an exemplary embodiment illustrated in FIGS. 6A and 6B. In this case, since most of the external connection electrode 16 is exposed externally, the insulation film 16a may be formed over an entire exposed surface of the external connection electrode 16 in a manufacturing process.

Here, the groove 17a formed in the protective insulation layer 17 and having the cylindrical shape may be formed in a process of manufacturing the protective insulation layer 17. In addition, the groove 17a may also be formed by forming the protective insulation layer 17 and performing a laser processing process, or the like, on the protective insulation layer 17.

In addition, the protective insulation layer 17 may be disposed spaced apart from the external connection electrodes 16 by a predetermined distance without covering or contacting the external connection electrodes 16. Therefore, the external connection electrodes 17 may be completely exposed to the exterior of the protective insulation layer 17.

Then, after the operations illustrated in FIGS. 4B to 4E are performed to complete the first molded part, an operation of forming the second molded part 35 may be performed, as illustrated in FIG. 8B. Here, the second molded part 35 may be filled in the grooves 17a formed in the protective insulation layer 17. In addition, the second molded part 35 may be firmly bonded to the external connection electrode 16 through the insulation film 16a.

Then, the via holes 37 may be formed, as illustrated in FIG. 8C. Then, surfaces of the external connection electrodes 16 exposed into the via holes 37 may be etched to remove the insulation film 16a, thereby completing a structure illustrated in FIG. 4G.

Then, after the connective conductors 20 are formed in an electroplating scheme as illustrated in FIG. 4H, the external terminals 28 may be formed at distal ends of the connective conductors 20 to complete the electronic device module 100.

As set forth above, in the electronic device module according to the exemplary embodiments of the present disclosure, the electronic devices may be mounted on both surfaces of the board and be sealed by the molded part. Therefore, many devices may be mounted in one electronic device module and be easily protected from the external environment.

In addition, the molded part may be directly bonded to the external connection electrodes through the insulation films. Therefore, the molded part may be very firmly bonded to the external connection electrodes.

Further, the delamination of the protective insulation layer from the external connection electrode due to the laser irradiated to the protective insulation layer in the laser drilling process may be prevented, such that the reliability of the plating may be secured.

While exemplary embodiments have been shown and described above, it will be apparent to those skilled in the art that modifications and variations could be made without departing from the scope of the present invention as defined by the appended claims.

What is claimed is:

1. An electronic device module comprising:
a board comprising a mounting electrode, an external connection electrode in direct contact with the board, and a protective insulation layer disposed on an outer surface of the board and a side surface and an outer surface of the external connection electrode;
an electronic device mounted on the mounting electrode;
a molded part sealing the electronic device; and
a connective conductor of which one end is bonded to the outer surface of the external connection electrode of the board and which penetrates through the molded part to be disposed in the molded part,
wherein the protective insulation layer on the outer surface of the external connection electrode is spaced apart from the connective conductor on the outer surface of the external connection electrode by a predetermined distance,
wherein a portion of the molded part is bonded to the external connection electrode, and
wherein an insulation film is interposed between the molded part and the external connection electrode.

2. The electronic device module of claim 1, wherein the molded part is disposed on the outer surface of the external connection electrode and interposed between the protective insulation layer and the connective conductor.

3. The electronic device module of claim 1, wherein the protective insulation layer covers a portion of the external connection electrode.

4. The electronic device module of claim 1, wherein the molded part is formed of an epoxy molding compound (EMC).

5. The electronic device module of claim 1, further comprising an external terminal coupled to another end of the connective conductor opposite to the one end of connective conductor that is bonded to the external connection electrode.

6. The electronic device module of claim 1, wherein the protective insulation layer extends from the outer surface of the board along the side surface of the external connection electrode to a predetermined distance greater than the side surface of the external connection electrode.

7. An electronic device module comprising:
a board comprising a mounting electrode and an external connection electrode each directly disposed on an outer surface of the board, the external connection electrode comprising an inner surface disposed facing the board and opposite an outer surface spaced apart from the inner surface by a side surface, the outer surface comprising a central portion, an edge portion, and a space portion separating the central portion from the edge portion by a predetermined distance;
an electronic device mounted on the mounting electrode;
a protective insulation layer disposed on the outer surface of the board and on the side surface and the edge portion of the outer surface of the external connection electrode;
a molded part sealing the electronic device and disposed on the space portion of the connection surface of the external connection electrode; and
a connective conductor extending through the molded part, bonded to the central portion of the outer surface of the external connection electrode, and spaced apart from the edge portion,
wherein an insulation film is interposed between the molded part and the external connection electrode.

8. An electronic device module comprising:
a board comprising:
a mounting electrode,
an external connection electrode in direct contact with the board, and comprising an inner surface disposed facing the board and opposite an outer surface spaced apart from the inner surface by a side surface, and
a protective insulation layer disposed on an outer surface of the board and spaced apart from the side surface of the external connection electrode by a first predetermined distance;
an electronic device mounted on the mounting electrode;
a molded part sealing the electronic device; and
a connective conductor of which one end is bonded to the outer surface of the external connection electrode of the board and which penetrates through the molded part to be disposed in the molded part,
wherein the one end of the connective conductor bonded to the outer surface of the external connection electrode of the board is spaced apart from the insulation layer on the outer surface of the board by a second predetermined distance.

9. The electronic device module of claim 8, wherein the first predetermined distance is substantially the same as the second predetermined distance.

10. The electronic device module of claim 8, wherein the first predetermined distance is less than the second predetermined distance.

11. The electronic device module of claim 8, wherein the first predetermined distance is greater than the second predetermined distance.

12. The electronic device module of claim 8, wherein the protective insulation layer extends from the outer surface of the board along the first predetermined distance from the side surface of the external connection electrode to a predetermined distance greater than a distance between the inner surface and the outer surface of the external connection electrode.

13. The electronic device module of claim 8, wherein the protective insulation layer extends from the outer surface of the board along the first predetermined distance from the side surface of the external connection electrode to a predetermined distance less than a distance between the inner surface and the outer surface of the external connection electrode.

14. The electronic device module of claim 8, wherein the molded part is interposed between the protective insulation layer and the connective conductor.

15. The electronic device module of claim 8, wherein a portion of the molded part is bonded to the external connection electrode.

16. The electronic device module of claim 15, wherein an insulation film is interposed between the molded part and the external connection electrode.

17. The electronic device module of claim 8, wherein the molded part is formed of an epoxy molding compound (EMC).

18. The electronic device module of claim 8, further comprising an external terminal coupled to another end of the connective conductor opposite to the one end of connective conductor that is bonded to the external connection electrode.

* * * * *